United States Patent
Zhu et al.

(10) Patent No.: US 9,429,630 B2
(45) Date of Patent: Aug. 30, 2016

(54) CIRCUIT FOR TESTING POWER SUPPLIES IN MULTIPLE POWER MODES

(71) Applicant: Freescale Semiconductor, Inc., Austin, TX (US)

(72) Inventors: Yong Zhu, Suzhou (CN); Shayan Zhang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 219 days.

(21) Appl. No.: 14/493,347

(22) Filed: Sep. 23, 2014

(65) Prior Publication Data

US 2015/0153409 A1    Jun. 4, 2015

(30) Foreign Application Priority Data

Dec. 3, 2013    (CN) .......................... 2013 1 0637398

(51) Int. Cl.
*G06F 11/00* (2006.01)
*G01R 31/40* (2014.01)
*G01R 31/317* (2006.01)

(52) U.S. Cl.
CPC ......... *G01R 31/40* (2013.01); *G01R 31/31721* (2013.01)

(58) Field of Classification Search
CPC .. G06F 11/2205; G06F 11/263; G06F 11/27; G06F 11/277; G06F 11/28; G01R 31/31721; G01R 31/3187; G01R 31/40
See application file for complete search history.

(56) References Cited

U.S. PATENT DOCUMENTS

| | | | |
|---|---|---|---|
| 6,826,100 B2 | 11/2004 | Ellis | |
| 7,213,172 B2 * | 5/2007 | Iovin | G06F 11/3656 714/22 |
| 7,567,060 B1 * | 7/2009 | Atcitty | G01R 31/40 307/64 |
| 7,917,806 B2 | 3/2011 | Anand | |
| 8,015,466 B2 | 9/2011 | Whetsel | |
| 8,028,195 B2 | 9/2011 | Anand | |
| 2002/0190742 A1 * | 12/2002 | Ooishi | G01R 31/2884 324/750.3 |
| 2003/0042485 A1 * | 3/2003 | Ooishi | G11C 29/02 257/48 |
| 2006/0284655 A1 * | 12/2006 | Li | G06F 1/28 327/143 |
| 2008/0262777 A1 * | 10/2008 | Kim | G01R 31/3004 702/117 |
| 2009/0158092 A1 * | 6/2009 | Anand | G01R 19/16552 714/30 |
| 2010/0231252 A1 * | 9/2010 | Goel | G01R 31/31715 324/750.3 |
| 2012/0013356 A1 * | 1/2012 | Eckert | G01R 31/31721 324/750.3 |
| 2013/0027053 A1 * | 1/2013 | Lee | G01R 31/31721 324/538 |
| 2013/0038361 A1 * | 2/2013 | Groot | H03K 19/0013 327/143 |
| 2013/0265060 A1 * | 10/2013 | Orendi | G01R 31/40 324/537 |
| 2014/0115394 A1 * | 4/2014 | Fattah | G06F 11/26 714/32 |
| 2015/0377981 A1 * | 12/2015 | Orendi | G01R 31/40 324/537 |

* cited by examiner

Primary Examiner — Marc Duncan

(57) ABSTRACT

A BIST circuit is provided for testing the status of power supplies in an integrated circuit in multiple power modes including multiple circuit blocks. The BIST circuit includes a finite state machine (FSM), power monitors and a comparator. The FSM sequentially enables at least two power mode states in a predetermined order. In each power mode state, the FSM outputs power mode signals to enable the power supplies used in the corresponding power mode. Each power monitor is connected to a power input node of one of the circuit blocks, and outputs a monitor signal indicative of the voltage at the corresponding power input node when the corresponding power supply is enabled. The comparator compares each monitor signal with a corresponding reference signal and generates a set of power supply status signals.

10 Claims, 4 Drawing Sheets

CIRCUIT FOR TESTING POWER SUPPLIES IN MULTIPLE POWER MODES

BACKGROUND OF THE INVENTION

The present invention relates to integrated circuits having multiple power supplies that operate in multiple power modes and, more particularly, to a built-in self test (BIST) circuit that tests the status of the power supplies in the multiple power modes.

Systems on a Chip (SOC) usually have multiple on-chip power supplies that operate in multiple power modes such as sleep, deep sleep, and functional mode. It is a complex task to test a SOC having a sophisticated power supply system with multiple power modes to verify the power supply system. In a typical design process, power supply connections are confirmed by a back-end team using CPF (Common Power Format). Thus, issues concerning power supply connections are found quite late in the design flow. Further, power supply connections may not even be verified for each of the different power modes. For example, a connection of a power supply to a circuit module may be checked but not necessarily checked to ensure the proper voltage is being supplied to the circuit module in each of its various power modes.

It also is important to check the status of the multiple power supplies, in the multiple power modes, during both manufacturing and operation. Therefore, there is a need for a technique for testing power supply status in multiple power modes during IC design, manufacturing test, and device operation.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale.

DETAILED DESCRIPTION OF THE INVENTION

According to one aspect of the present invention, a BIST circuit is provided for testing the status of power supplies in N power modes (N>1) of a system such as a SOC that has a plurality of circuit blocks that receive power from respective ones of the power supplies. The BIST circuit comprises a finite state machine (FSM), power monitors and a comparator. The FSM has at least two power mode states respectively corresponding to at least two of the N power modes, and sequentially enables the at least two power mode states in a predetermined order. In each power mode state, the FSM outputs power mode signals that enable the power supplies used in the corresponding power mode. Each of the power monitors is connected to a power input node of one of the circuit blocks that is provided with one of the power supplies, and when the power supply connected to the corresponding power input node is enabled, output a monitor signal indicative of the voltage at the corresponding power input node. The comparator compares the monitor signals with corresponding reference signals and generates a set of status signals that indicate whether corresponding ones of the power supplies and their connection with the corresponding power input node are operating correctly.

The embodiments of the present invention provide a circuit for easily testing the status of multiple power supplies, in multiple power modes, of an IC in the IC design phase, during manufacturing, and in operation (for example, when the chip is undergoing a Power-on-Reset (POR)). Further, the BIST circuit of the present invention has a simple structure and can be readily implemented.

Further features of the present invention will become apparent from the following detailed description of exemplary embodiments with reference to the attached drawings. The present invention is described in detail below using a SOC as an example application. However, it will be apparent to those skilled in the art that the present invention is not limited to SOCs.

Figure 1:
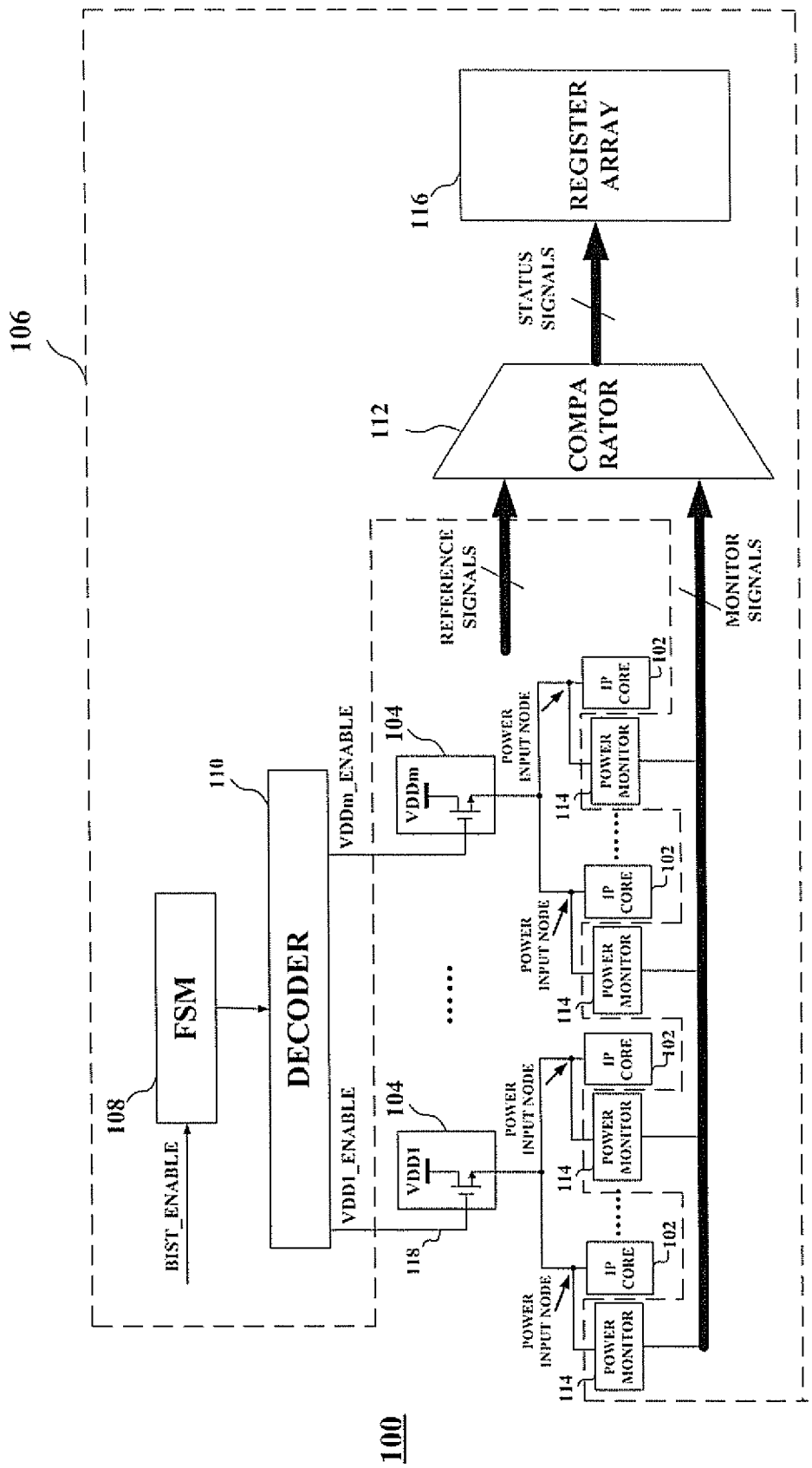
FIG. 1 is a schematic block diagram of a SOC including a BIST circuit for testing the status of power supplies, in multiple power modes, in accordance with an embodiment of the present invention.

Referring now to FIG. 1, a schematic block diagram of a SOC 100 having a plurality of IP (Intellectual Property) cores 102 connected to various ones of a plurality of power supplies 104, and a power BIST circuit 106 is shown. The IP cores 102 may comprise various types of circuits such as processors, memories, etc., as is known in the art. The IP cores 102 may operate in various power modes such as functional or operational mode, sleep mode, deep sleep mode, etc. Thus, the power supplies 104 provide the various cores 102 with the appropriate voltages depending on the mode of the core 102. The power supplies 104 each include a NMOS transistor, as a switch, with a gate connected to the power BIST circuit 106 for receiving a power mode signal, a source connected to a power input node of a respective one of the IP cores, and a drain connected to a supply voltage VDD1 to VDDm, obtained, for example, from a DC-DC converter. It should be noted that the power supplies 104 shown in FIG. 1 are exemplary only, and a simple structure power supply is illustrated for ease of understanding, and it will be apparent to those skilled in the art that the structure of the power supply 104 is not limited to the above-described example, and can comprise various structures as long as the power supply 104 can be enabled/disabled by one or more input signals from the power BIST circuit 106.

The power BIST circuit 106 is provided for testing the status of the power supplies 108, in the multiple power modes, in accordance with an embodiment of the present invention. The BIST circuit 106 includes a finite state machine (FSM) 108, a comparator 112, and a number of power monitors 114 (one for each core 102) that are connected to the comparator 112. In some embodiments, the BIST circuit 106 may also includes a decoder 110, and a memory or register array 116 connected to an output of the comparator 112. The BIST circuit 106 is activated by a BIST_ENABLE signal that is provided to the FSM 108.

Figure 2:
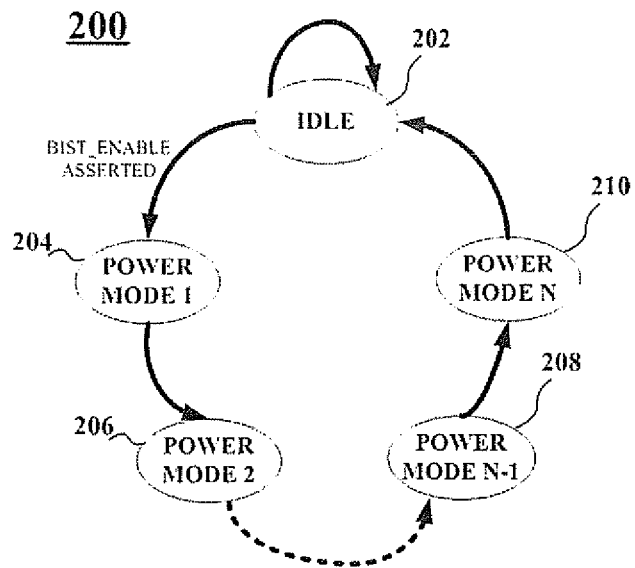
FIG. 2 is a state diagram of a finite state machine (FSM) according to a preferred embodiment of the present invention.

FIG. 2 shows a state diagram 200 of the FSM 108 according to one embodiment of the present invention. As shown in FIG. 2, when the BIST circuit is not activated, the FSM 108 is at an idle state 202. Once the BIST_ENABLE signal is asserted, the BIST circuit 106 is activated and the FSM 108 moves from the idle state 202 to a first power mode state 204. The FSM 108 then sequentially enables the N multiple power modes of the power supplies 104 in a predetermined order; where N is an integer greater than 1, moving from the first power mode state 204 to a next one 206, and so forth through power mode states 208 and 210. In each of the power mode states 204-210, the FSM 108 outputs power mode signals that enable the power supplies 104 used in the corresponding power mode. Each power mode state 204-210 lasts several clock periods to ensure the entire process for testing the status of the power supplies 104, as described in detail below, is completed. The FSM 108 can be implemented using a programmable logic device, a programmable logic controller, logic gates and flip-flops, or relays, as will be understood by those of skill in the art.

In some cases, it may not be necessary to enable each of the N power modes for a given test. That is, if some of the power modes are not used, then the unused power modes can be bypassed in a test.

In one embodiment of the present invention, in each power mode state 204-210, the FSM 108 outputs a set of power mode signals 118, each controlling one of the power supplies 104. If a power supply is used in this power mode, the corresponding power mode signal 118 input to the power supply is activated (logic high), which turns on the switch (NMOS transistor), and accordingly enables power to be supplied to the corresponding IP core 102. On the other hand, if a power supply is not used in this power mode, the power mode signal 118 to the power supply is inactive (logic low), which turns off the switch, and thus prevents the supply of power to the corresponding IP core 102.

The power mode signal is generated by the decoder 110, which is connected to the FSM 108. In one embodiment, in each power mode state 204-210, the FSM 108 outputs a coded power mode signal (using one or more bits) to the decoder 110. The decoder 110 then decodes the coded power mode signal and outputs the power mode signal 118 for controlling the power supplies 104. It should be noted that the power mode signal 118 comprises a set of signals provided to the respective power supplies 104; only one signal line is shown going to all of the power supplies 104 for convenience.

Each IP core 102 is connected to a respective one of the power monitors 114. Then, during each of the power mode states 204-210, the power supplies 104 are monitored by the power monitors 114. The power monitors 114 are used to verify whether the power supplies 104 are operating at their expected level and whether their connections with corresponding power input nodes of the IP cores 102 are correct.

The power monitors 114 are connected to respective power input nodes of the IP cores 102. When the power supply 104 is enabled, the power monitor 114 monitors the voltage at the power input node, i.e., the voltage supplied from the power supply 104, and outputs a monitor signal indicative of the voltage at the power input node. The monitor signals are input to the comparator 112 and compared with respective reference signals, and the comparator 112 generates a set of status signals that indicate whether the corresponding power supply 108 and its connection with the corresponding power input node are operating correctly or not. The status signals generated by the comparator 112 may be stored in a memory or register array 116 prior to being output from the SOC 100.

Figure 3:
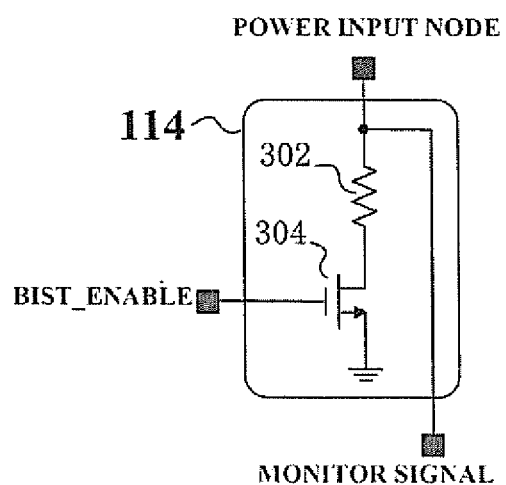
FIG. 3 is a schematic circuit diagram of a power monitor according to a preferred embodiment of the present invention.

FIG. 3 is a schematic circuit diagram of an exemplary power monitor 114 in accordance with an embodiment of the present invention. The power monitor 114 is connected to a power input node of an IP core 102, receives the BIST_ENABLE signal used to activate the BIST circuit 106, and outputs the monitor signal indicative of the voltage at the power input node. The power monitor 114 includes a pull-down resistor 302 and a switch 304. In a preferred embodiment, the switch 304 comprises a NMOS transistor. A first end of the pull-down resistor 302 is connected to the power input node, and a second end is connected to the drain of the NMOS transistor 304. The gate of the NMOS transistor 304 receives the BIST_ENABLE signal, and the source of the NMOS transistor 304 is connected to ground. The monitor signal is output from a node between the first end of the resistor 302 and the power input node of the IP core 102.

The switch 304 helps to reduce leakage when the BIST circuit 106 is disabled. In an alternative embodiment, the switch 304 may be controlled by the power mode signal 118 instead of the BIST_ENABLE signal.

In operation, when the BIST_ENABLE signal is asserted, the BIST circuit 106 is activated and the power supply 104 test procedure starts. The BIST_ENABLE signal turns on the NMOS transistor 304. When the power supply provided to the power input node is enabled, normally, the supply voltage appears at the power input node, and is output as the monitor signal. If the power supply 104 or the connection to the power input node fails, or if there is integration error on this connection, the power input node will be floating, and its potential will be pulled down by the resistor 302 and the NMOS transistor 304 to ground potential. In one embodiment, the pull-down resistor 302 is a high-sheet resistor. That is, when the power supply 104 and its connection with the power input node are operating correctly, the power monitor 114 outputs the supply voltage of the power supply 104 as the monitor signal to the comparator 112. Alternatively, when the power supply 104 or the connection fails (including malfunction in the power supply circuitry, or there is an integration error), the power monitor 114 outputs a low (ground potential) monitor signal to the comparator 112. In addition, please note that, in this example shown in FIG. 3, if the power supply 104 associated with the power monitor 114 is not enabled, the power monitor signal output by the power monitor 114 also is low.

Figure 4:
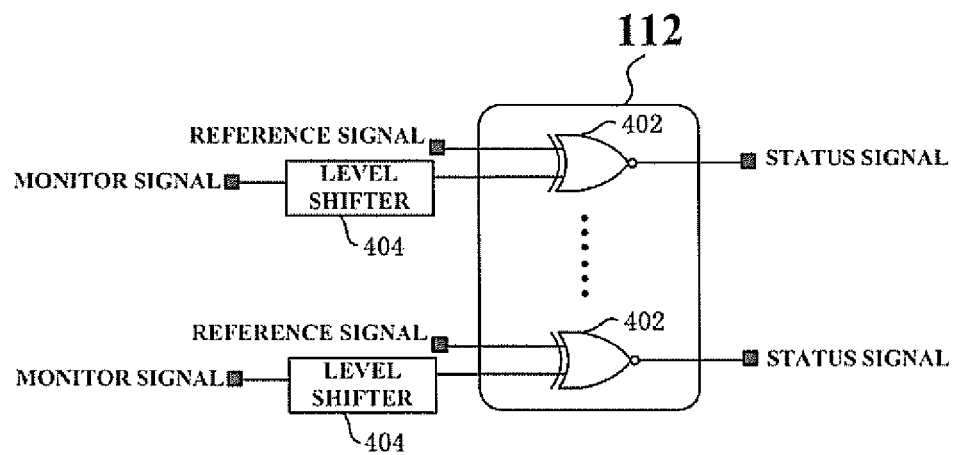
FIG. 4 is a schematic block diagram of a comparator according to an embodiment of the present invention.

FIG. 4 is a schematic block diagram of the comparator 112 in accordance with an embodiment of the present invention. In this embodiment, the comparator 112 comprises a set of two input XNOR gates 402 that receive respective reference signals and a respective one of the monitor signals. The number of XNOR gates 402 is equal to the number of monitor signals. When the two inputs have the same logic value, the XNOR gate 402 outputs a logic "1" as the status signal; otherwise, the XNOR gate 402 outputs a logic "0" as the status signal. It will be understood for those skilled in the art that the comparator 112 is not limited to comprising the XNOR gates 402, but may be implemented by various kinds of devices including various logic gates (e.g., AND gate, OR gate, XOR gate, etc.) based on specific applications.

In a simple implementation, all of the XNOR gates 402 are identical, which means logic "1" in these gates is at the same high level. However, the multiple power supplies 104 may have different supply voltages, and in many cases, these supply voltages are different from the logic "1" level of the XNOR gate 402, so the supply voltages may need to be converted to the logic "1" level of the XNOR gate 402. Such shifting of the voltage levels may be accomplished using level shifters 404 connected before the input to the XNOR gates 402.

In the example shown in FIG. 4, the reference signal is an expected value of the corresponding monitor signal in the current power mode. The reference signals can be generated based on the current power mode. The reference signal may be logic "1" when the associated power supply is enabled, and logic "0" when the associated power supply is disabled. Then, all of the output status signals are logic "1" if there are no failures or no error is found in any of the multiple power supplies 104 and their connections. In such case, all of the status signals may be output to an AND gate so that only one pass/fail signal is finally output to indicate whether the entire power supply system of the SOC 100 in the current power mode is operating correctly or not.

In some cases, all of the status signals can be stored in the memory or register array 116, which would allow for more easily determining which power supply or which connection in the power supply system has a fault.

Figure 5:
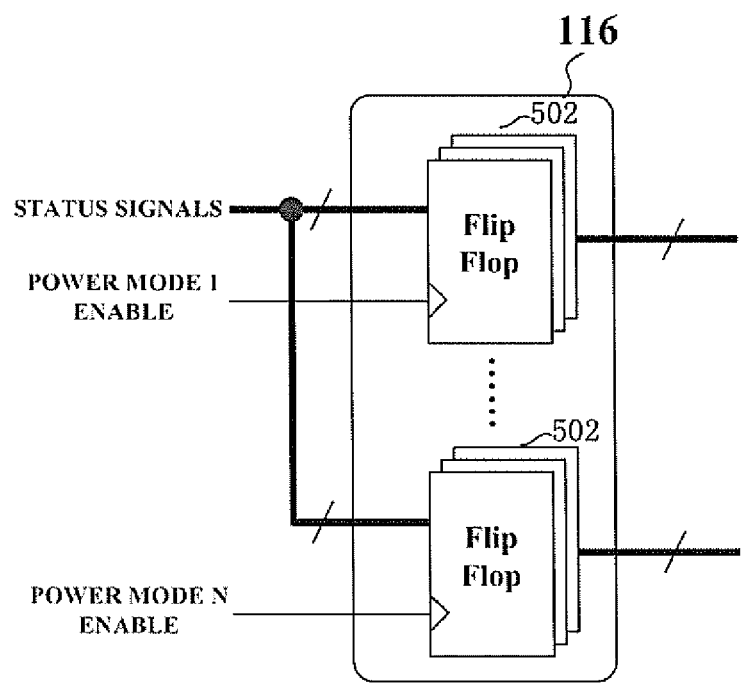
FIG. 5 is a schematic block diagram of a memory according to a preferred embodiment of the present invention.

FIG. 5 is a schematic block diagram of the register array 116 according to a preferred embodiment of the present invention. The register array 116 includes N (the above-described number of power modes) groups of flip-flops 502. The groups of flip-flops 502 are used to store the status signals generated in respective ones of the power modes. A power enable signal used to enable the corresponding power mode is connected to each of the clock input terminals of the flip-flops 502 in a group. When the clock input is high, i.e., when the enable signal is asserted and the corresponding power mode is enabled, the flip-flops 502 store the status signals. The data stored in the flip-flops 502 can be easily scanned out via a test port, e.g., JTAG. It will be understood by those skilled in the art that the register array 116 may comprise other types or arrangements of storage elements.

Figure 6:
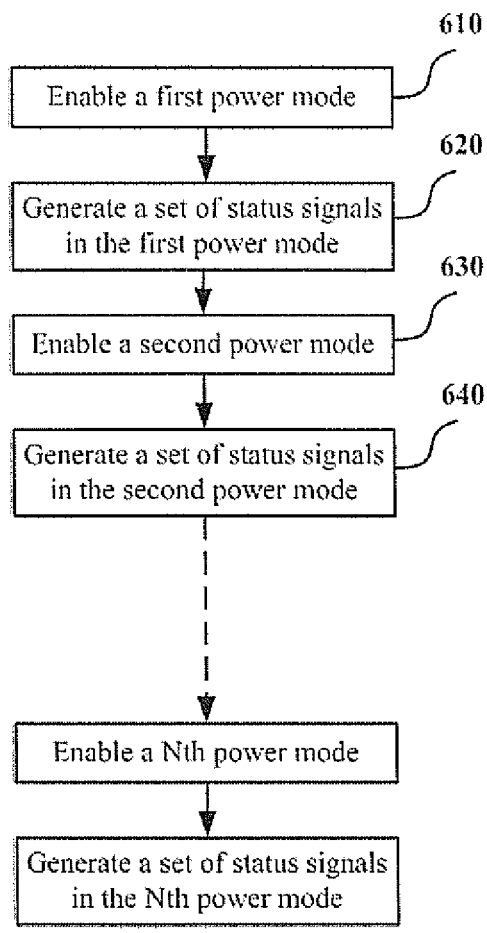
FIG. 6 is a flow chart illustrating a method for testing the status of multiple power supplies in a plurality of power modes in accordance with an embodiment of the present invention.

FIG. 6 is a flow chart illustrating a method for testing the status of multiple power supplies in N power modes (where N is an integer>1) in accordance with one embodiment of the present invention. As per the FSM 108, the multiple power modes are sequentially enabled in a predetermined order. However, the method according to the present invention is not limited to this embodiment, and the present invention can apply to the case where only some of the N power modes are sequentially enabled in a predetermined order.

Referring again to FIG. 6, the test flow starts with enabling a first power mode of N power modes at enabling step 610. Then, at generating step 620, during a period when the SOC 100 is in the first power mode, a set of status signals for the power supplies 104 used in the first power mode are generated. The status signals respectively indicate whether a corresponding power supply and its connection with a corresponding power input node are operating correctly or not.

Next, a second power mode of the N power modes is enabled at enabling step 630. Then, like step 620, at generating step 640, when the SOC 100 is in the second power mode, a set of status signals for the power supplies used in the second power mode is generated. The enabling and generating steps are repeated for the remaining power modes in the predetermined order.

Figure 7:
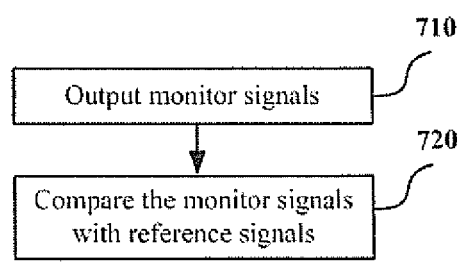
FIG. 7 is a flow illustrating a method of generating status signals of FIG. 6 in accordance with one embodiment of the present invention.

The generating steps 620, 640 can be achieved by the steps shown in FIG. 7. Specifically, for each power mode, the set of status signals is generated by performing steps 710 and 720. At step 710, the monitor signals from the power monitors 114 are output to the comparator 112; that is, as discussed above, when the power provided to a power input node is enabled, a monitor signal indicative of the voltage at this power input node is output. At step 720, the monitor signals are compared with respective corresponding reference signals and the set of status signals is generated by the comparator 112.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

The invention claimed is:

1. A built-in self test (BIST) circuit for testing the status of a plurality of power supplies that operate in N power modes where N>1, of a system including a plurality of circuit blocks connected to respective ones of the plurality of power supplies, the BIST circuit comprising:
 a finite state machine (FSM) having at least two power mode states respectively corresponding to at least two of the N power modes, wherein the FSM sequentially enables the at least two power mode states in a predetermined order, and in each power mode state, outputs one or more power mode signals to the power supplies to enable the power supplies used in the corresponding power mode;
 a plurality of power monitors, each connected to a respective power input node of a respective one of the plurality of circuit blocks, wherein each power monitor outputs a monitor signal indicative of the voltage at the corresponding power input node when the power supply provided to the corresponding power input node is enabled; and
 a comparator that receives the monitor signals and compares the monitor signals with corresponding reference signals, and generates a set of status signals that respectively indicate whether the corresponding power supply and a connection with the corresponding power input node are operating correctly.

2. The BIST circuit of claim 1, wherein each of the power monitors includes a pull-down resistor and a switch, wherein a first end of the pull-down resistor is connected to the corresponding power input node, the switch is connected between a second end of the pull-down resistor and ground, and the switch is controlled by at least one of a BIST enable signal that activates the BIST circuit or the power mode signal that enables the corresponding power supply.

3. The BIST circuit of claim 2, wherein the switch is an NMOS transistor.

4. The BIST circuit of claim 2, wherein the pull-down resistor is a high-sheet resistor.

5. The BIST circuit of claim 1, wherein the comparator comprises a set of XNOR gates, wherein each of the XNOR gates has two input terminals, one of the input terminals receiving one of the monitor signals and the other of the input terminals receiving a reference signal, and an output terminal for providing one of the status signals.

6. The BIST circuit of claim 5, further comprising:
   level shifters, connected between each power monitor and the comparator, wherein the level shifters shift a high level of the corresponding monitor signal to a predetermined level and output the shifted monitor signal to the comparator.

7. The BIST circuit of claim 1, further comprising a memory connected to the comparator for storing the set of status signals.

8. The BIST circuit of claim 7, wherein the memory comprises a register array.

9. The BIST circuit of claim 8, wherein the register array comprises N groups of flip-flops, wherein each group of flip-flops stores a set of status signals generated in one of the power modes, and has clock input terminals that receive respective ones of the power mode signals generated by the FSM.

10. The BIST circuit of claim 1, further comprising:
    a decoder, connected to the FSM, for decoding a coded power mode signal generated by the FSM and providing the power enable signals for enabling the power supplies used in the corresponding power mode.

* * * * *